United States Patent [19]

Doyle, Jr.

[11] Patent Number: 4,852,015
[45] Date of Patent: Jul. 25, 1989

[54] AUTOMATIC CIRCUIT LAYOUT ROUTER
[75] Inventor: John J. Doyle, Jr., Fridley, Minn.
[73] Assignee: ETA Systems, Inc., St. Paul, Minn.
[21] Appl. No.: 65,929
[22] Filed: Jun. 24, 1987
[51] Int. Cl.$^4$ ............................................. G06F 15/20
[52] U.S. Cl. ................................... 364/491; 364/490; 364/489; 364/488
[58] Field of Search ................. 364/488, 489, 490, 491
[56] References Cited

U.S. PATENT DOCUMENTS

| 4,093,990 | 6/1978 | Koller et al. | 364/491 |
| 4,541,114 | 9/1985 | Rutenbar et al. | 364/491 |
| 4,580,228 | 4/1986 | Noto | 364/491 |
| 4,584,653 | 4/1986 | Chih et al. | 364/491 |
| 4,613,941 | 9/1986 | Smith et al. | 364/490 |
| 4,651,284 | 3/1987 | Watanabe et al. | 364/491 |

OTHER PUBLICATIONS

"Theory and Concepts of Circuit Layout", T. C. Hu et al., IEEE Press, 1985, pp. 3–18.
"A Routing Program Applicable to Various Chip Structures of Gate Arrays", Masayuki Terai et al., Ronbunshi, vol. 25, No. 3, May, 1984, pp. 357–364.
Howard E. Krohn, "An Over-Cell Array Channel Router", Published as Paper 41.1 of IEEE 20th Design Automation Conference, 1983, pp. 665–670.

Primary Examiner—Parshotam S. Lall
Assistant Examiner—V. N. Trans
Attorney, Agent, or Firm—Kinney & Lange

[57] ABSTRACT

A method for operating a digital computer to globally route interconnects between terminals of a gate array. A first terminal closest to an average position of terminals to be interconnected is identified. A second terminal closest to the first terminal is then identified, and a first path between the first and second terminals is established along possible paths. An edge of the first path is set as a routing path if predetermined conditions are met. A closest remaining terminal to an established path is next identified, and a shortest path between the closest terminal and the established path to which it was closest is established. Edges of the shortest path and/or the established path to which it was closest are set as routing paths, if predetermined conditions are met. The above steps are then repeated for remaining terminals to be interconnected. Any possible paths within established paths with no set edges can then be set as routing paths.

6 Claims, 11 Drawing Sheets

```
                                                                    36
                                                                   /
┌─────────────────────────────────────────────────────────┐
│ DETERMINE THE CENTER OF GRAVITY OF THE TERMINALS        │──36-1
│ OF THE NET.                                             │
└─────────────────────────────────────────────────────────┘
                             │
                             ▼
┌─────────────────────────────────────────────────────────┐
│ DETERMINE THE DISTANCE, IN TERMS OF VERTICAL            │──36-2
│ AND/OR HORIZONTAL CHANNELS, OF EACH TERMINAL OF THE     │
│ NET FROM THE CENTER OF GRAVITY.                         │
└─────────────────────────────────────────────────────────┘
                             │
                             ▼
┌─────────────────────────────────────────────────────────┐
│ IDENTIFY A FIRST TERMINAL CLOSEST TO THE CENTER OF      │──36-3
│ GRAVITY.                                                │
└─────────────────────────────────────────────────────────┘
                             │
                             ▼
┌─────────────────────────────────────────────────────────┐
│ DETERMINE THE DISTANCE, IN TERMS OF VERTICAL AND/OR     │──36-4
│ HORIZONTAL CHANNELS, OF REMAINING TERMINALS OF THE      │
│ NET FROM THE FIRST TERMINAL.                            │
└─────────────────────────────────────────────────────────┘
                             │
                             ▼
┌─────────────────────────────────────────────────────────┐
│ IDENTIFY A SECOND TERMINAL CLOSEST TO THE FIRST         │──36-5
│ TERMINAL.                                               │
└─────────────────────────────────────────────────────────┘
                             │
                             ▼
┌─────────────────────────────────────────────────────────┐
│ ESTABLISH A FIRST PATH BETWEEN THE FIRST AND            │──36-6
│ SECOND TERMINALS ALONG VERTICAL AND/OR HORIZONTAL       │
│ CHANNELS                                                │
│  ┌ ─ ─ ─ ─ ─ ─ ─ ─ ─ ─ ─ ─ ─ ─ ─ ─ ─ ─ ─ ─ ─ ─ ─ ─ ┐   │──36-6(a)
│    THE FIRST PATH WILL BE RECTANGULAR AND              │
│  │ HAVE FOUR EDGES AND FOUR VERTICES             │     │
│    INCLUDING THE FIRST AND SECOND TERMINALS            │
│  │ WHEN THE FIRST AND SECOND TERMINALS ARE AT    │     │
│    DIFFERENT VERTICAL AND DIFFERENT                    │
│  │ HORIZONTAL CHANNELS.                          │     │
│  ├ ─ ─ ─ ─ ─ ─ ─ ─ ─ ─ ─ ─ ─ ─ ─ ─ ─ ─ ─ ─ ─ ─ ─ ┤   │──36-6(b)
│  │ THE FIRST PATH WILL BE A LINE AND HAVE ONE   │     │
│    EDGE AND TWO VERTICES INCLUDING THE FIRST           │
│  │ AND SECOND TERMINALS WHEN THE FIRST AND      │     │
│    SECOND TERMINALS ARE AT THE SAME VERTICAL           │
│  │ OR SAME HORIZONTAL CHANNELS.                 │     │
│  └ ─ ─ ─ ─ ─ ─ ─ ─ ─ ─ ─ ─ ─ ─ ─ ─ ─ ─ ─ ─ ─ ─ ─ ┘   │
└─────────────────────────────────────────────────────────┘
                             │
                             ▼
┌─────────────────────────────────────────────────────────┐
│ SET THE EDGE OF THE FIRST PATH AS A ROUTING             │──36-7
│ CHANNEL IF THE FIRST PATH IS A LINE.                    │
└─────────────────────────────────────────────────────────┘
                             │
                             ▼
┌─────────────────────────────────────────────────────────┐
│ DETERMINE THE DISTANCE, IN TERMS OF VERTICAL            │──36-8
│ AND/OR HORIZONTAL CHANNELS, OF REMAINING TERMINALS      │
│ OF THE NET FROM EITHER AN EDGE OR VERTEX OF AN          │
│ ESTABLISHED PATH HAVING NO SET EDGES OR FROM A SET      │
│ EDGE OR ITS VERTICES OF AN ESTABLISHED PATH WHICH       │
│ HAS ONE OR MORE SET EDGES, WHICHEVER IS CLOSEST.        │
│ ◇A                                                      │
└─────────────────────────────────────────────────────────┘
                             │
                             ▼
```

36-14
REESTABLISH THE SHORTEST PATH IF THE SHORTEST PATH IS A LINE AND DOES NOT HAVE A VERTEX COMMON WITH A VERTEX OF THE ESTABLISHED PATH. THE REESTABLISHED SHORTEST PATH WILL BE A RECTANGLE AND HAVE FOUR EDGES AND FOUR VERTICES INCLUDING A VERTEX AT THE LOCATION OF THE CLOSEST TERMINAL, A VERTEX AT THE LOCATION AT WHICH THE SHORTEST PATH INTERSECTED THE ESTABLISHED PATH (OR THE REESTABLISHED ESTABLISHED PATH), AND A VERTEX COMMON WITH THE VERTEX OF THE ESTABLISHED PATH (PRIOR TO IT BEING REESTABLISHED IF IT WAS REESTABLISHED) WHICH IS ALSO A TERMINAL.

36-15
SET AS ROUTING CHANNELS EDGES OF THE REESTABLISHED SHORTEST PATH WHICH COUPLE ITS VERTICES WHICH ARE ALSO TERMINALS AND WHICH HAVE A VERTEX IN COMMON

36-16
SET AS ROUTING CHANNELS EDGES OF THE REESTABLISHED SHORTEST PATH WHICH COUPLE ITS VERTICES WHICH ARE ALSO TERMINALS AND WHICH HAVE A VERTEX IN COMMON WITH THE ESTABLISHED PATH (OR THE REESTABLISHED ESTABLISHED PATH).

36-17
REPEAT STEPS 36-8 THROUGH 36-15 FOR ALL REMAINING TERMINALS OF THE NET.

ANY REMAINING TERMINALS OF THE NET? — YES  A

NO

END

AUTOMATIC CIRCUIT LAYOUT ROUTER

BACKGROUND OF THE INVENTION

1. Field of the Invention

The present invention relates to a method for operating a computer as an integrated circuit layout router to lay out or determine interconnect paths between circuit elements or macros on an integrated circuit. In particular, the present invention is a method for globally assigning interconnect paths to vertical and horizontal routing channels of a gate array.

2. Description of the Prior Art

Gate arrays are commonly used integrated circuits on which a large number of transistors are fabricated in a geometric pattern of vertical columns and horizontal rows. During subsequent manufacturing steps, the gate array is personalized by interconnecting individual transistors to form basic circuit elements or macros, and interconnecting the macros to form a functional integrated circuit with larger scale logic systems. This customization of the gate array is done through the application of several metal interconnect layers over the transistors. Each metal layer is typically partitioned into a plurality of vertical routing channels and horizontal routing channels. Each vertical routing channel includes a plurality of possible routing paths or tracks. Similarly, each vertical routing channel includes a plurality of possible vertical routing tracks.

Routing tracks for macro intraconnect metal, the metal used to connect individual transistors and form the macros, is predetermined. Once the location of a macro is established, the precise horizontal and vertical routing tracks to which the macro intraconnect metal will be applied can be determined.

After all the macro intraconnects on a gate array have been established, it is necessary to route or assign the macro interconnect metal, the metal used to interconnect the macros, to horizontal and vertical routing tracks. Various procedures for routing macro interconnect metal are known. Utilizing one known procedure a net list, a group of macro terminals which must be interconnected, is first identified. Interconnects between terminals of the net are then globally routed to vertical and horizontal routing channels. One global router algorithm permits interconnects to be assigned to any routing channels within a rectangular area encompassing all terminals of the net. A maze router is then used to assign horizontal segments of the globally routed interconnects to specific tracks of the horizontal channels. This procedure is repeated for all nets on the integrated circuit. Finally, a channel router is used to assign vertical segments of the globally routed interconnects to specific tracks of the vertical channels.

To increase the performance of integrated circuit gate arrays, designers are increasing the density of transistors fabricated thereon. The transistors are therefore being spaced ever closer to one another, decreasing the amount of space available for interconnects. The overall size of gate arrays is also increasing, permitting larger numbers of macros to be fabricated on the gate array and thereby increase its capabilities. The more macros formed on the gate array, however, the greater the demands that are placed upon the router. Problems resulting from the increased transistor density are therefore compounded. In view of the fact that the spacing between transistors is being decreased while the amount of space required for routing tracks is finite, the number of available tracks for routing intraconnect and interconnect metal with respect to the number of transistors in a given area on the integrated circuit is decreasing.

It is evident that with the increase in size and density of gate arrays there is a continuing need for improved methods for routing interconnect metal. The routing procedure must efficiently utilize available routing paths to reduce wiring congestion. It is important for the router to keep the length of macro interconnects to a minimum to reduce skews or timing errors due to signal propagation delays. Reliability, the ability to route all required interconnects, and speed, are also required of the router.

SUMMARY OF THE INVENTION

The present invention is a method for operating a digital computer to establish routing paths, along an x-y grid of possible paths, between a plurality of terminals on an integrated circuit. The average position on the grid of a group of terminals to be interconnected is first determined. A first terminal closest to the average position along x and/or y paths of the grid is then identified. A second terminal closest to the first terminal along x and/or y paths of the grid is also identified.

Having identified the first and second terminals, a first path between these terminals along x and/or y paths of the grids is established. The first path is rectangular and has four edges and four vertices including the first and second terminals when the first and second terminals are on different x and different y paths. If the first and second terminals are on the same x or same y path, the first path is a line and has one edge and two vertices including the first and second terminals. The edge of the first path is then set as a routing path if the first path is a line.

A closest remaining terminal which is closest, along x and/or y paths of the grid, to an edge or vertex of an established path having no set edges, or to a set edge or its vertices of an established path which has a set edge, whichever is closest, is then identified. A shortest path along x and/or y paths between the closest terminal and the edge or vertex of the established path to which it is closest is then established. The shortest path is rectangular and has four edges and four vertices including the closest terminal and a vertex common with a vertex of the established path when the shortest path requires traversal of both x and y paths. The shortest path is a line and has an edge and two vertices including the closest terminal when the shortest path requires traversal of only x or only y paths.

Edges of the established path which couple its vertices which include terminals and which have a vertex in common with a vertex of the shortest path are set as routing paths if the established path has no set edges and the common vertex does not include a terminal. The edge of the shortest path which couples the closest terminal to the edge or vertex of the established path is set as a routing path if the shortest path is a line and has a vertex common with a vertex of the established path, or is a line and has a vertex at a set edge of the established path. The above steps, beginning with the step of identifying the closest remaining terminal, are then repeated for all remaining terminals to be interconnected.

In one preferred embodiment, the method further includes the step of setting as routing paths any of the possible paths within and including the edges of the established paths which have no set edges and which couple the terminals of the established paths to a vertex or set edge of an established path having a set edge.

In still other embodiments, the established path which the current shortest path intersects is reestablished if it is a rectangle with no set edges and the shortest path is a line which does not have a vertex in common with a vertex of the established path. The reestablished path will be rectangular and have four edges and four vertices including two vertices of the established path and a vertex common with the vertex of the shortest path which intersected the established path. The shortest path is then reestablished if it is a line and does not have a vertex common with a vertex of the established path. The reestablished shortest path will be a rectangle and have four edges and four vertices including a vertex common with the closest terminal, a vertex at the intersection of the shortest path and the established path, and a vertex common with a vertex of the established path which includes a terminal. Edges of the reestablished shortest path which couple its vertices which are also terminals and which have a vertex in common with the established path are then set as routing paths.

The router of the present invention can quickly and accurately route virtually all required interconnects on an integrated circuit such as a gate array. Available routing paths are efficiently utilized to keep wiring congestion to a minimum. Desirable gate array characteristics such as increased transistor density and overall array size are thereby facilitated.

DETAILED DESCRIPTION OF THE PREFERRED EMBODIMENTS

Figure 1:
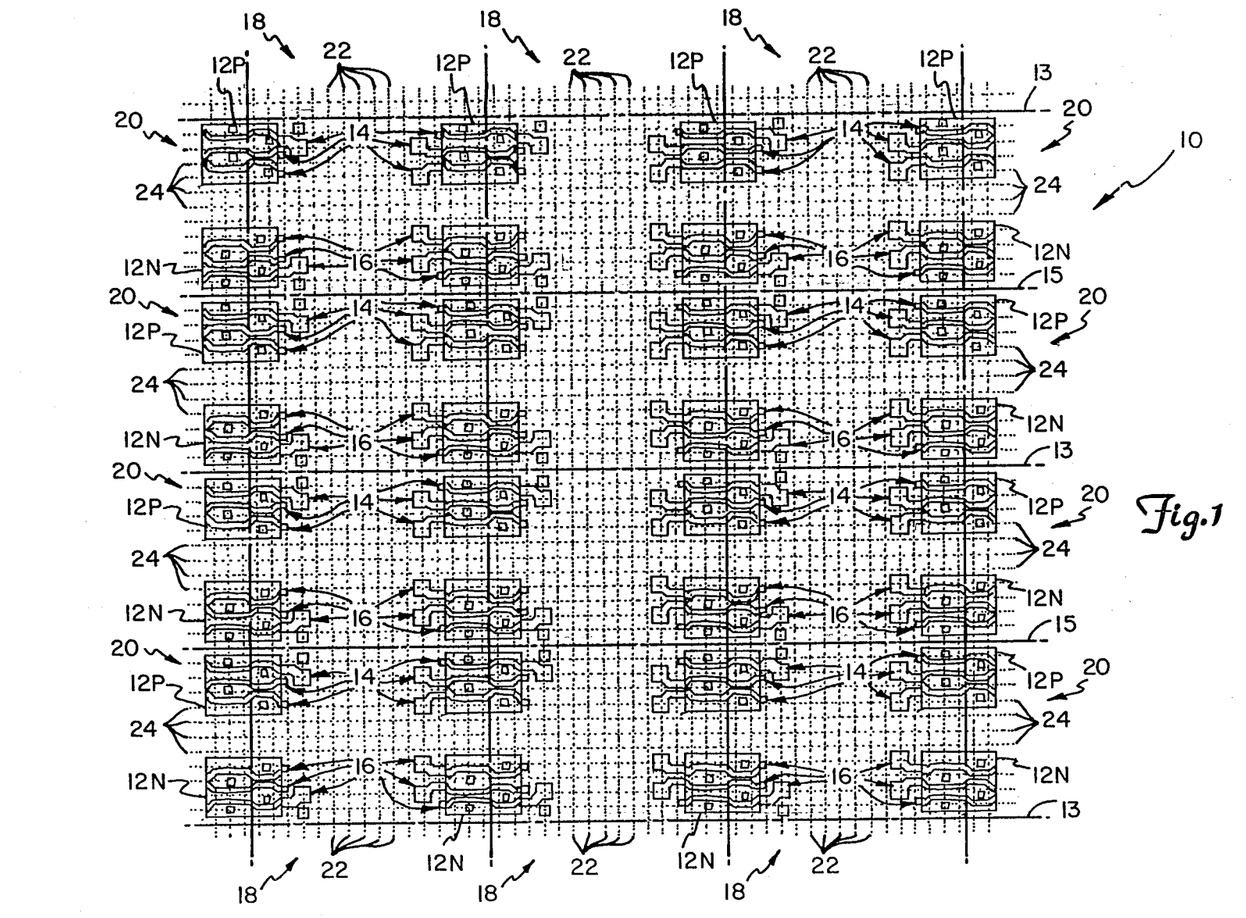
FIG. 1 is a graphic representation of a portion of a gate array having transistors fabricated thereon.

The present invention is a method for operating a programmable digital computer as an automatic integrated circuit layout router to lay out routing or interconnect paths on an integrated circuit such as gate array 10 which is illustrated in FIG. 1. Gate arrays such as that illustrated in FIG. 1 are well known. Gate array 10 is fabricated using CMOS technology in one embodiment, and includes a plurality of positive supply rails 13 alternately positioned between and parallel to negative supply rails 15. A plurality of P-channel cells 12P and N-channel cells 12N which are arranged in vertical columns and horizontal rows are also fabricated on gate array 10. In the embodiment shown, each cell 12P includes three P-channel transistors 14, while cells 12N include three N-channel transistors 16. Only a portion of gate array 10 is shown in FIG. 1. In one embodiment, gate array 10 is ninety-five cells 12P and 12N wide, and one hundred and twenty-seven cells high.

Gate array 10 is personalized, or has its P-channel transistors 14 and N-channel transistors 16 interconnected to form circuit elements or macros and the macros interconnected to form larger scale logic systems, by two metal interconnect layers (not shown). Each metal layer is partitioned into a plurality of vertical routing channels 18 and horizontal routing channels 20. For purposes of convention, sides of vertical routing channels 18 are shown centered over cells 12P and 12N, while sides of horizontal routing channels 20 are centered on supply rails 13 and 15.

In the embodiment shown, each vertical routing channel 18 includes sixteen possible vertical routing paths or tracks 22 at which interconnect metal can be deposited on one of the two metal layers. Horizontal routing channels 20 each include eleven possible horizontal routing paths or tracks 24 at which interconnect metal can be deposited. Vertical routing tracks 22 and horizontal routing tracks 24 thereby form an orthogonal x-y grid of possible routing paths over gate array 10. It is to be understood that although routing paths 22 and 24 are illustrated by broken lines in FIG. 1, they represent no physical structure of gate array 10 and are simply possible locations for interconnect metal. As a general rule, metal interconnects along vertical tracks 22 are made on the first metal layer, while interconnects along horizontal tracks 24 are made on the second metal layer. The first and second metal layers are separated by an insulating layer in a well known manner. Vias, the interconnections between metal layers, can be made at designated intersections of vertical routing tracks 22 and horizontal routing tracks 24. In one embodiment only diagonally adjacent vias are permitted. Orthogonally adjacent vias are not allowed at any intersection.

Figure 2:
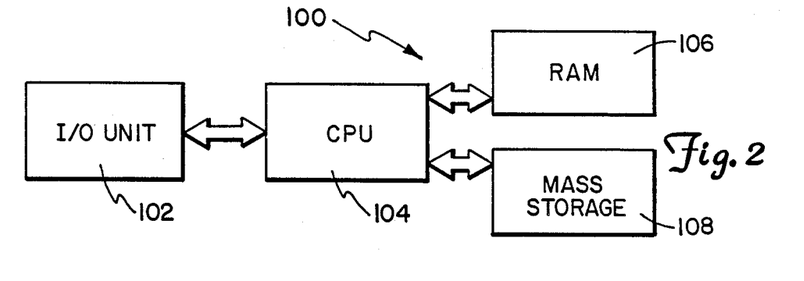
FIG. 2 is a block diagram representation of a computer in which the automatic circuit layout router of the present invention can be implemented.

The routing procedure of the present invention is preferably implemented by a digital computer 100 such as that illustrated generally in FIG. 8. Computer 100 includes an input/output (I/O) unit 102, central processing unit (CPU) 104, random access memory (RAM) 106 and mass storage memory 108 such as magnetic tape. Macro intraconnects, the relative paths by which metal is applied to gate array 10 to fabricate particular macros from transistors 14 and 16, and contact cuts, the interconnections between the first metal layer and transistors 14 and 16 of cells 12P and 12N, respectively, are predetermined, and data characteristic thereof will be stored in RAM 106 or mass storage 108.

Data required to personalize a particular gate array 10, including that characteristic of macros to be fabricated on the gate array, their locations and the interconnections required between macros, is input to computer 100 through I/O unit 102. This data can be stored within RAM 106. Instruction data characterizing the router algorithm of the present invention can be stored in mass storage 108. The input data is processed by CPU 104 in accordance with the router algorithm to generate data representative of the particular vertical tracks 22 and horizontal tracks 24 to which interconnect metal will be applied to interconnect terminals of the macros. This data, along with data from intermediate processing steps, is stored in RAM 106. Data characterizing all interconnects on gate array 10 is then output from computer 100 to I/O unit 102 (e.g. on magnetic tape), and used to personalize the gate array during fabrication.

Figure 3:
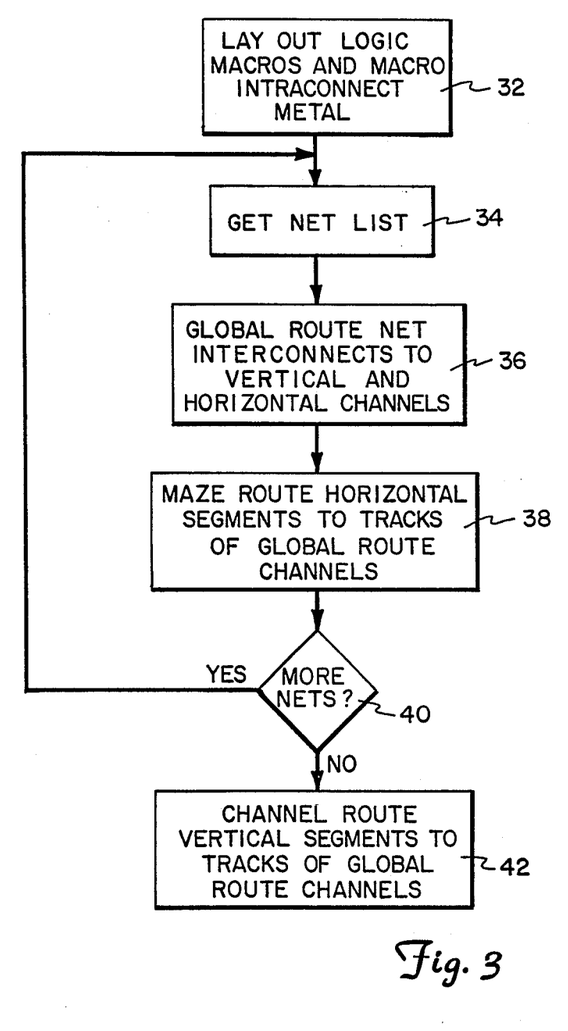
FIG. 3 is a flow chart describing a routing procedure which can include a global routing method in accordance with the present invention.

The router algorithm of the present invention, or the procedure utilized by computer 100 to determine routing paths on gate array 10, is described generally with reference to FIG. 3. The first step, that indicated by 32, is to lay out or position the logic macros and the macro intraconnect metal on gate array 10. This step is performed by storing data characterizing the particular transistors 14 and 16 from which the macro will be constructed, and the particular tracks 22 and 24 to which intraconnect metal will be applied to form the logic macros. As described above, relative intraconnections between transistors 14 and 16 for each macro within a macro or cell library are predetermined and stored in memory. Once the particular transistors 14 and 16 which will be used to fabricate the macro are identified the particular tracks 22 and 24 to which metal must be applied can be quickly determined, and data representative thereof stored. Following this procedure, data characterizing macros such as gates, shift registers, multiplexers, etc., which depending upon their complexity can use from two to over one hundred cells 12P and 12N, can be stored in RAM 106. Layout procedures such as those described above with reference to step 32 are well known.

Figure 4:
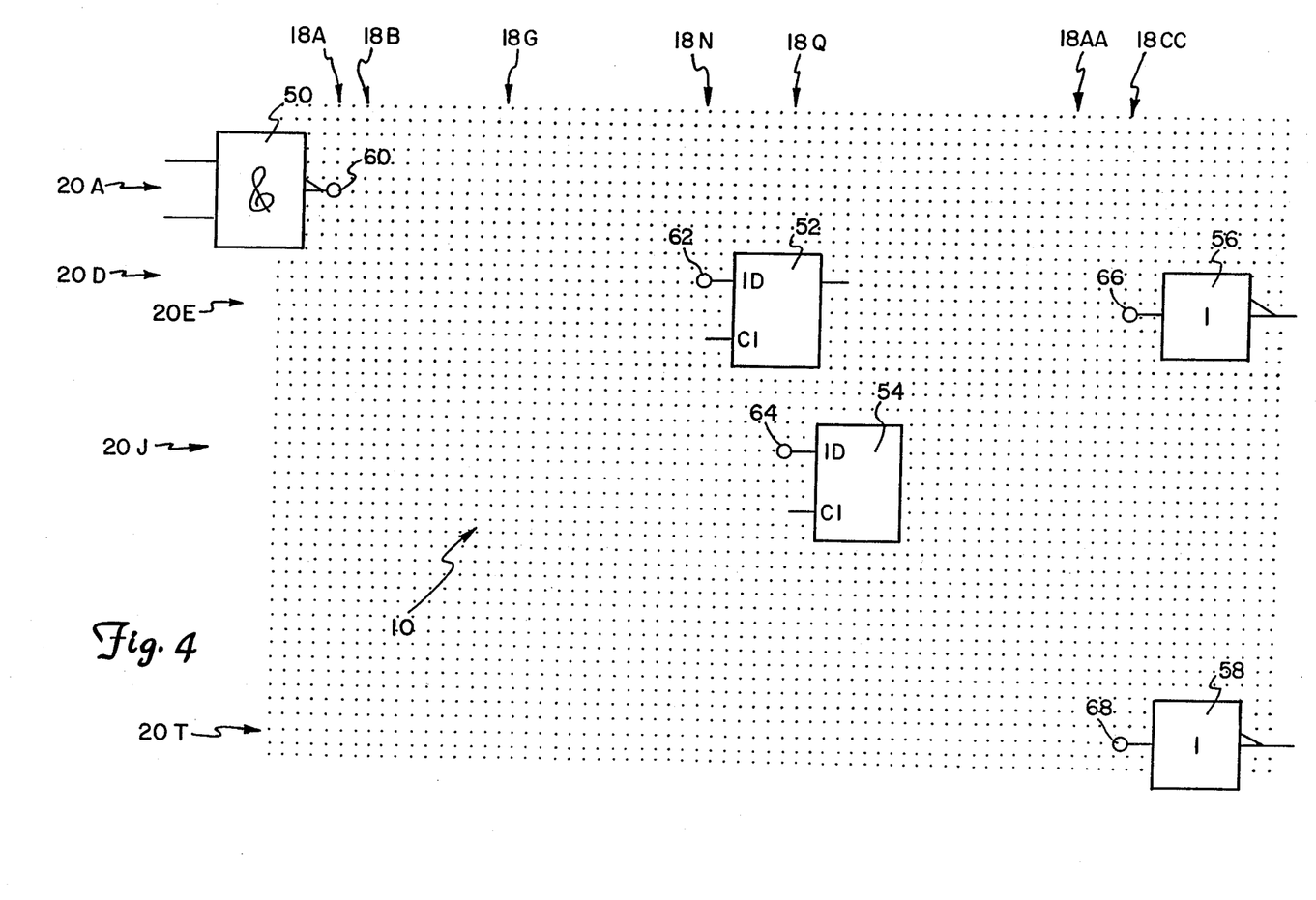
FIG. 4 is a graphic representation of a gate array such as that shown in FIG. 1 on which circuit elements, represented in schematic form, have been fabricated, and illustrating possible routing tracks.

FIG. 4 is a graphical representation of a plurality of logic macros including AND gate 50, D flip-flops 52 and 54, and inverters 56 and 58 which are positioned at specific locations on gate array 10. Although gate 50, flip-flops 52 and 54 and inverters 56 and 58 are illustrated schematically for purposes of example, it is to be understood that these logic macros are actually formed by transistors 14 and 16 which are interconnected by macro intraconnect metal. Vertical routing channels 18A-18CC and horizontal routing channels 20A-20T are illustrated in FIG. 4. As shown, AND gate 50 has an output terminal 60 at the intersection of channels 18A and 20A. Flip-flops 62 and 64 have input terminals 62 and 64 located at intersections of channels 18N and 20D, and 18Q and 20J, respectively. Inverters 56 and 58 have input terminals 66 and 68 located at intersections of channels 18CC and 20E, and 18CC and 20T, respectively.

Referring back to FIG. 3, after macro intraconnect metal has been layed out and data representative thereof stored in memory, the macros themselves must be interconnected. This procedure is initiated by identifying a net list as indicated at step 34. The net list is a group of macro terminals which must be interconnected. Using the macros of FIG. 4 as an example, output terminal 60 of AND gate 50 must be connected to D input terminals 62 and 64 of flip-flops 52 and 54, respectively, and to input terminals 66 and 68 of inverters 56 and 58, respectively. This particular net list will include data representative of terminals 60, 62, 64, 66 and 68, and their locations on gate array 10. This data will be stored in RAM 106 (FIG. 2). Procedures for obtaining and storing data representative of net lists and represented by step 34 are well known.

Once a net list is gathered, a global routing algorithm is followed by computer 100 to determine which segments or portions of which vertical channels 18A-18CC and which horizontal channels 20A-20T the interconnect metal will follow. Global routing is indicated by step 36 in FIG. 3. Data representative of a set of instructions characterizing the global routing algorithm will be stored in mass storage 108 (FIG. 2). A detailed description of a global router algorithm in accordance with the present invention is given subsequently.

After global routing of a given net has been completed, portions or segments of the interconnect paths within horizontal channels 20A-20T are assigned to specific horizontal tracks 24 within the horizontal channels. In one embodiment, a maze router algorithm is used for this purpose. This step is illustrated at 38 in FIG. 3. Instructions characteristic of the maze router algorithm can be stored in ROM 108. Maze router algorithms of this type are well known.

As indicated at step 40 in FIG. 3, the next step performed by the computer is to determine whether or not there are any more nets on integrated circuit 10 which must still be global routed and maze routed. If there are additional nets, computer 100 first gathers the net list as illustrated at step 34, performs a global route of the net interconnects to vertical channels 18A-18CC and horizontal channels 20A-20T as shown at step 36, and maze routes the horizontal segments to horizontal tracks 24 as illustrated by step 38. These steps can be performed in a manner identical to those described above.

Finally, after all nets on gate array 10 have been global routed and maze routed in the manner described above, a channel router is implemented to assign all vertical segments of each net to specific vertical tracks 22 of the vertical channels 18S-18CC. This step is illustrated at 42 in FIG. 3. In one embodiment, a dogleg channel router is used for this purpose. Channel routers of this type are well known.

Figure 5A:
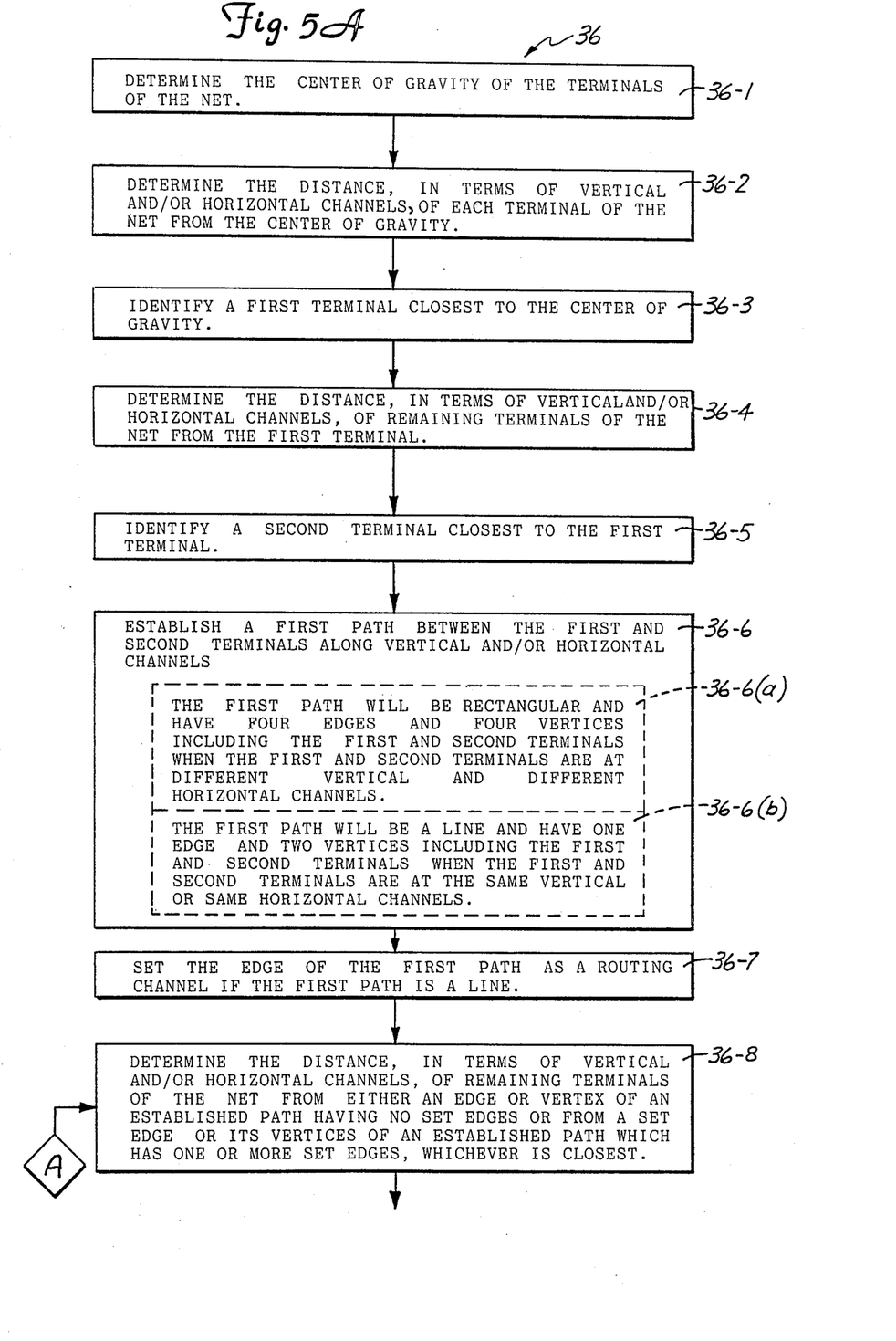
FIGS. 5A–5C are flow charts of the routing method of the present invention.
Figure 5B:
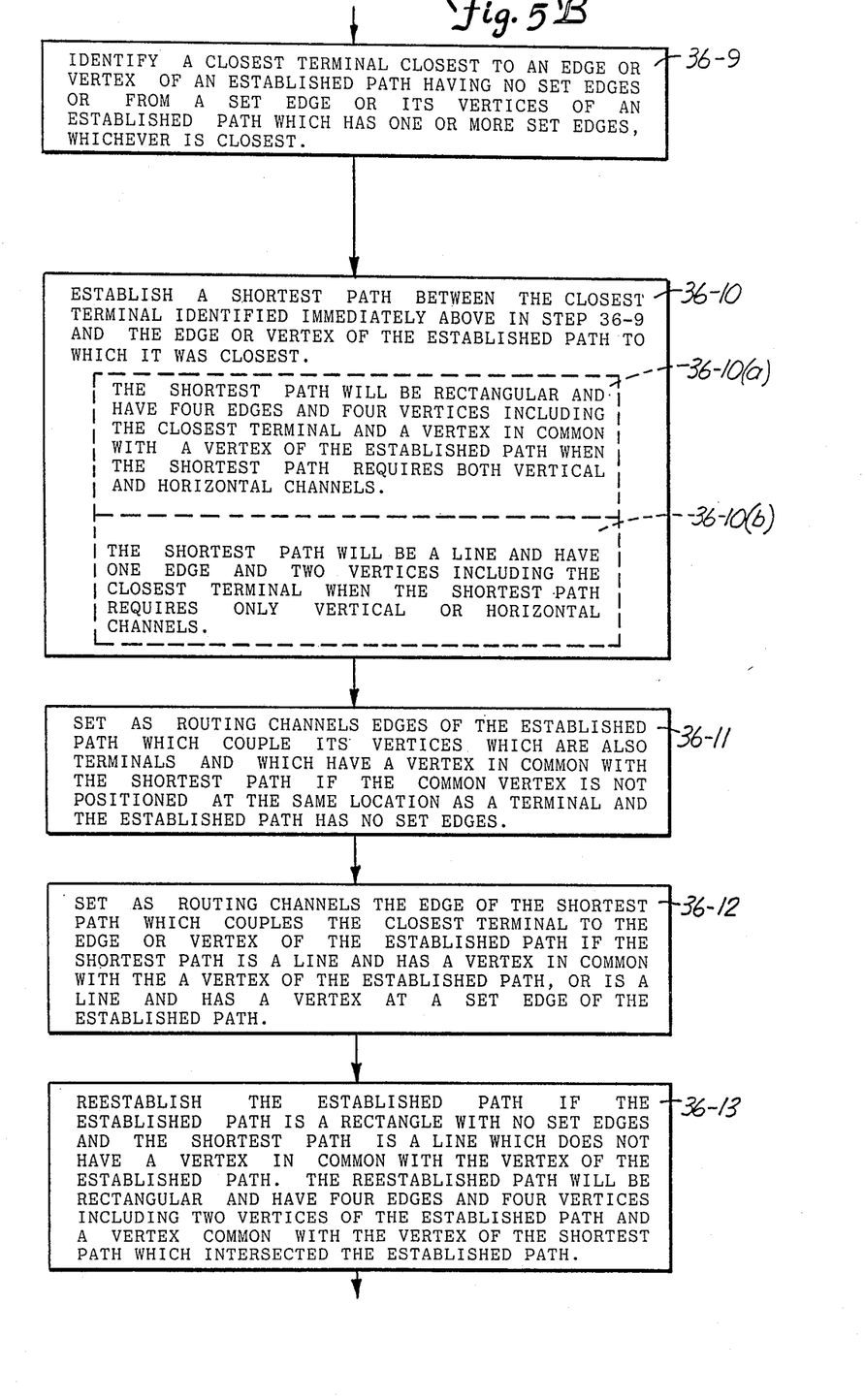
Figure 5C:
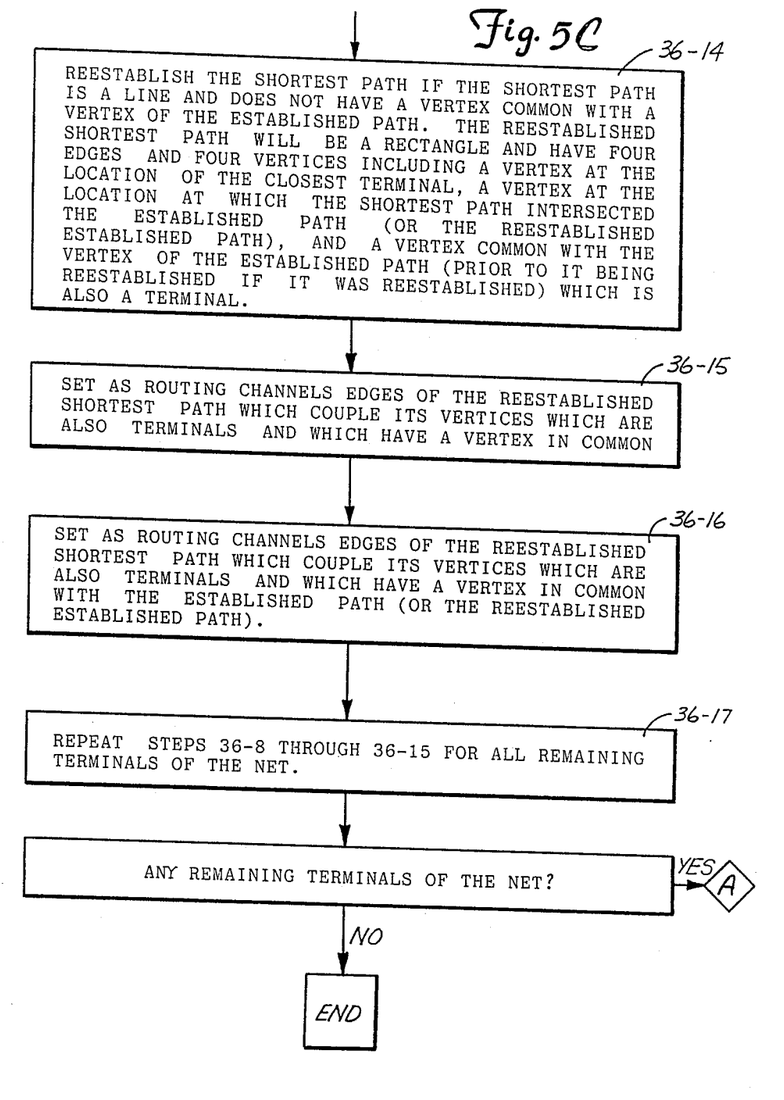

A global router algorithm in accordance with the present invention, which can be utilized at step 36 in the overall routing procedure described above, is described with reference to FIGS. 5 and 6A-6E. FIG. 5 is a flow chart which describes in detail the steps of the global router algorithm which was described generally at step 36. FIGS. 6A-6E are graphical representations of the application of the global router algorithm by computer 100 to interconnect the net formed by terminals 60, 62, 64, 66 and 68 of macros 50, 52, 54, 56 and 58, respectively, shown in FIG. 4.

First step 36-1 implemented by computer 100 in accordance with global router algorithm 36 is to determine an average position of all terminals of the net, e.g., terminals 60, 62, 64, 66 and 68. In the embodiment described, step 36-1 is performed by computing a center of gravity in terms of the average x or horizontal channel 18A-18CC position, and the average y or vertical channel 20A-20T position. In the example illustrated in FIG. 6A, terminal 60 is at an x-y channel position of (18A,20A), while terminals 62, 64, 66, and 68 have channel positions of (18N,20D), (18Q,20J), (18CC,20E), and (18CC,20T), respectively. A center of gravity (CG) of terminals 60, 62, 64, 66 and 68 is found by a simple average to be located at a channel position of (18R,20H).

In accordance with second step 36-2, computer 100 will next compute the distance, in terms of the number of horizontal channels 18A-18CC and vertical channels 20A-20T, by which each terminal 60, 62, 64, 66 and 68 within the net is separated from center of gravity CG. Utilizing this information, a first terminal which is closest to center of gravity CG can be identified as indicated by step 36-3. In the example shown in FIG. 6A, terminal 64 is closest to center of gravity CG, being one vertical channel 18A-18CC and two horizontal channels 20A-20T therefrom. If more than one terminal 60, 62, 64, 66 and 68 was the same closest distance from center of gravity CG, any can be used as the first terminal.

Following the router algorithm, computer 100 next computes the distance of all other remaining terminals of the net, e.g., terminals 60, 62, 66 and 68 in the above example, from the first terminal identified in step 36-3, e.g., terminal 64. This procedure is described by step 36-4 in FIG. 5. A second terminal which is closest to the first terminal can be identified using this information, as described by step 36-5. In the above example, terminal 62 is the remaining terminal of the net which is closest to first terminal 64, being three vertical channels 18A–18CC and six horizontal channels 20A–20T therefrom. Terminal 62 is therefore identified as the second terminal in this example. If more than one terminal is the same closest distance to the first terminal, any of them can be used as the second terminal.

Having identified terminals 64 and 62 as the first and second terminals, respectively, computer 100 will next establish a first path between these terminals along vertical routing channels 18A–18CC and/or horizontal routing channels 20A–20T. This step of the router algorithm is described at 36-6 in FIG. 5, with first established path 70 illustrated in FIG. 6A. Terminals 62 and 64 are located on different vertical channels 18A–18CC and different horizontal channels 20A–20T. First path 70 is therefore rectangular and has four edges 72A–72D (as described by step 36-6(a)) which are illustrated by broken lines. Path 70 also has four vertices 74A–74D. These and subsequently discussed vertices are illustrated by circular dots in FIGS. 6A–6E. Vertex 74A is located at the same position on gate array 10 as terminal 62, while vertex 74C is located at the same position as terminal 64 (i.e., the four vertices of path 70 include terminals 62 and 64).

Had the first and second terminals been located on the same vertical channel 18A–18CC or the same horizontal channel 20A–20T, the first path would have been a line with one edge and two vertices including the first and second terminals. This path would then have been set as a routing channel. These steps are described at 36-6(b) and 36-7 in FIG. 5. An example of a situation of this type is described in subsequent portions of this specification.

With first path 70 established, computer 100 continues implementing the router algorithm by determining the shortest distance of each remaining terminal of the net to either an edge or vertex of an established path which has no edges set as a routing channel (set edges), or to a set edge of an established path which has a set edge, whichever is closest. Using this information, a remaining or next terminal which is closest to either an edge or vertex of an established path which does not have any set edges, or to a set edge or its vertices of an established path which does have a set edge, can be determined. These steps are described at 36-8 and 36-9 in FIG. 5. Following the above example, computer 100 will determine the shortest distance from each of terminals 60, 66, and 68 from one of edges 72A–72D or vertices 74A–74D of path 70. In this example, terminal 66 will be identified as the closest terminal to path 70, being twelve vertical channels 18A–18CC from edge 72B.

Having identified the next or closest remaining terminal in the manner described above, a new shortest path between the closest terminal and the edge or vertex to which it was closest is established by computer 100 as indicated by step 36-10. In the above example, path 76 is the shortest path between closest terminal 66 and edge 72B. Since edge 72B intersects horizontal channel 20E and terminal 66 is positioned in channel 20E, path 76 is a straight line falling solely along horizontal channel 20E (i.e., no vertical channels 18A–18CC are traversed) as described by step 36-10(b) in FIG. 5. As shown, path 76 has an edge 78 and vertices 80A and 80B. Vertex 80A is located at the same position as (i.e., includes) terminal 66, while vertex 80B is located at the position at which edge 78 intersects edge 72B.

Had the shortest path between the closest remaining terminal and the edge or vertex to which it is closest required traversal of both vertical channels 18A–18CC and horizontal channels 20A–20T, the shortest path would have been rectangular and had four edges and four vertices (step 36-10(a)). The four vertices would then have included the closest terminal and a vertex in common with a vertex of the previously established path. An example of a situation of this type is described in subsequent portions of this specification.

Following steps 36-11 and 36-12 of the router algorithm described in FIG. 5, computer 100 will set edges of established path 70 and/or shortest path 76 as routing channels if certain conditions are met. Edges 72A and 72B of established path 70 which couple their vertices 74A and 74C located at the same position as terminals 62 and 64, respectively, would be set as routing channels if established path 70 and shortest path 76 had a common vertex which is not a terminal, and the established path has no set edges (step 36-11). In the above example illustrated in FIG. 6A, however, path 70 and path 76 do not have a vertex in common (i.e., vertex 80B is not a vertex of path 70) so this condition is not met. The edge of shortest path 76 which couples closest terminal 66 to edge 72 of path 70 would be set as a routing path if path 76 is a line and has a vertex in common with a vertex of established path 70, or if path 76 is a line and has a vertex at a set edge of established path 70 (step 36-12). In the above example, however, although path 76 is a line, its vertex 80B is not common with a vertex of established path 70, and path 70 has no set edges. Since these conditions are not met, no edges of path 70 or 76 will be set as routing channels by computer 100 at this point.

Computer 100 will next determine whether established path 70 to which closest terminal 66 is coupled, and/or shortest path 76 which couples terminal 66 to path 70, should be reestablished (steps 36-13 and 36-14). Established path 70 is reestablished when, as in the above example, it is a rectangle and none of its edges 72A–72D are set, and shortest path 76 is a line and neither of its vertices 80A or 80B is common with a vertex 74A–74D of established path 70. Shortest path 76 is reestablished when, as in the above example, it is a line and neither of its vertices 80A and 80B is common with one of vertices 74A–74D of path 70.

Figure 6A:
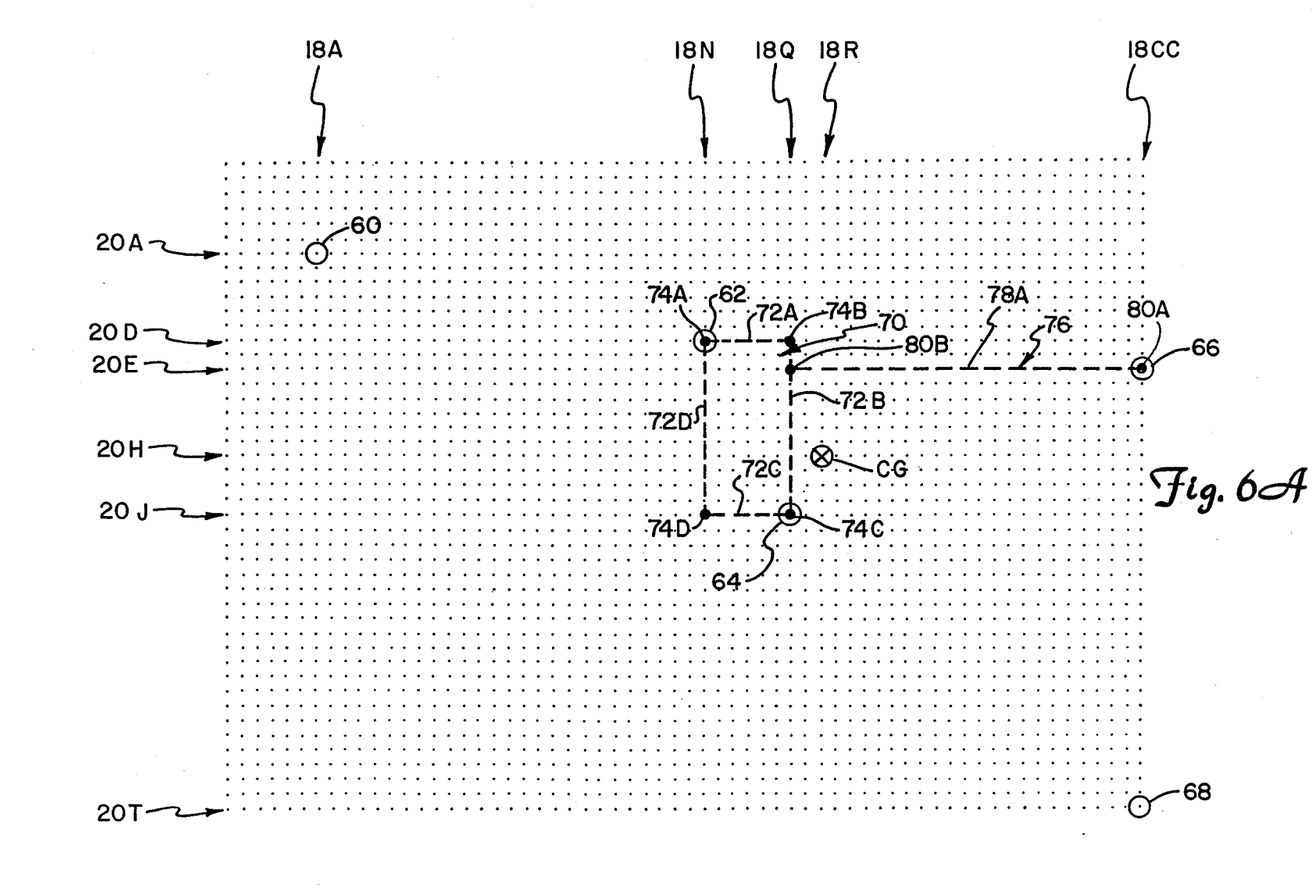
FIG. 6A–6E graphically illustrate the routing procedure of the present invention as applied to the circuit layout of the gate array shown in FIG. 4.
Figure 6B:
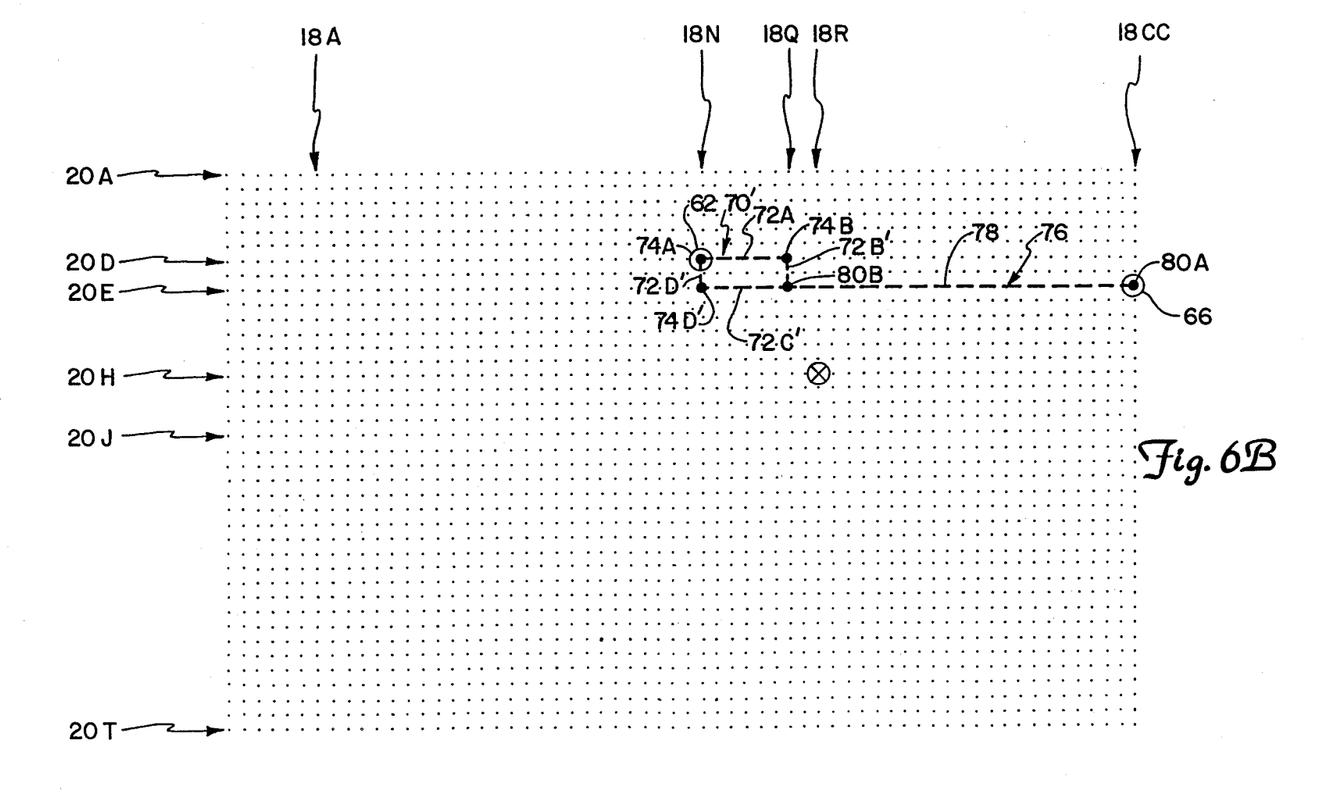

Established path 70 is reestablished as reestablished path 70′ and is illustrated in FIG. 6B. As shown, reestablished path 70′ is rectangular and has four edges 72A, 72B′, 72C′ and 72D′, and four vertices 74A, 74B, 80B and 74D′. Vertices 74A and 74B are at the same location as vertices 74A and 74B of original established path 70. Edge 72A of reestablished path 70′ is therefore the same as edge 72A of established path 70. Vertex 80B is common with or the same vertex as 80B of current shortest path 76, and is therefore located at the position at which edge 78 of shortest path 76 intersected edge 72B of established path 70.

Figure 6C:
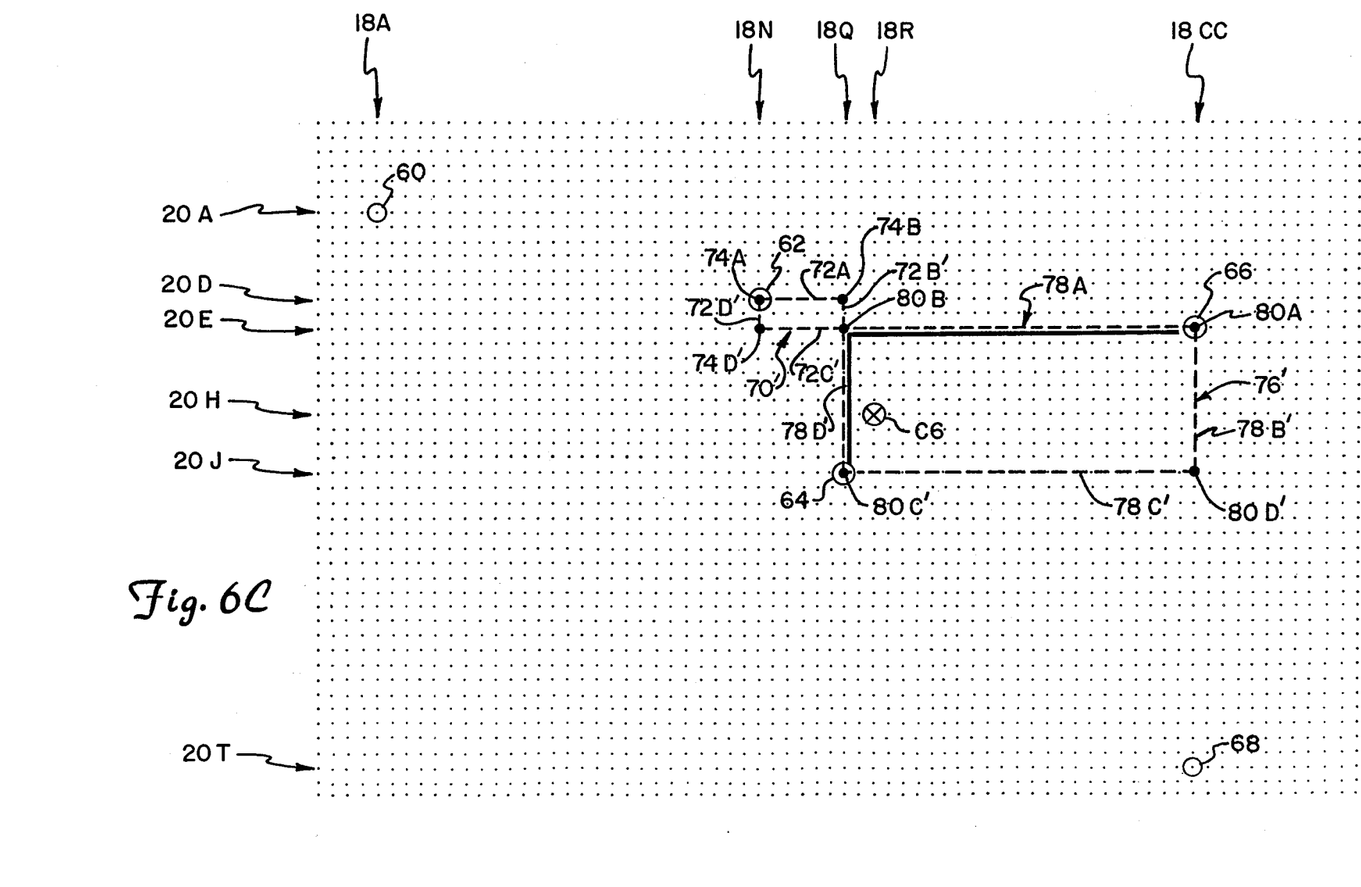

Shortest path 76 is reestablished as reestablished shortest path 76' and is illustrated in FIG. 6C. As shown, reestablished shortest path 76' is rectangular and includes edges 78A, 78B', 78C' and 78D', and vertices 80A, 80B, 80C' and 80D'. Edge 78 of path 76' is the same edge as edge 78 of path 76. Vertices 80A and 80B of path 76' are the same vertices as vertices 80A and 80B of path 76. Vertex 80A positioned at the same location as current closest terminal 66. Vertex 80B located at the position that original shortest path 76 had intersected original established path 70. Vertex 80C' is located at a position common with vertex 74C of established path 70 (prior to its being reestablished as path 76') which is also at the same position as terminal 64.

After computer 100 has reestablished a shortest path such as 76, the router algorithm calls for the computer to set as routing channels edges of the reestablished shortest path which couple its vertices which are also terminals and which have a vertex in common with the established path (or the reestablished established path if the established path was reestablished). Following the above example, edges 78A and 78D' of reestablished shortest path 76' are set as routing channels as indicated by the solid lines in FIG. 6C. Edges 78A and 78D' of path 76' couple current closest terminal 66 to terminal 64 which is at the same location as vertex 80C' of path 76', while edge 78A was also edge 78 of path 76. Edges 78A and 78D' also include vertex 80B, which is a vertex common with reestablished path 70'.

Having established a routing channel between terminal 66 and terminal 64, the router algorithm calls for computer 100 to repeat the above described procedures (steps 36-8 through 36-15) for remaining terminals of the net. At this point, all paths currently established, or those which have been reestablished, are characterized as established paths for purposes of step 36-8. The terminal identified at step 36-9 is characterized as the "closest" terminal for this sequence of steps 36-8 through 36-15. The path to which the terminal identified at step 36-9 is closest is characterized as the "established" path for this repetition of steps 36-8 through 36-15.

In the example used above, terminals 60 and 68 remain. Computer 100 will then compute the shortest distance from each terminal 60 and 68 to edges 72A, 72B'-72D' or vertices 74A, 74B, 80B and 74D' of established path 70', or to set edges 78A and 78D', or their vertices 80A, 80B and 80C', of established path 76'. Terminal 68 is fifteen horizontal channels 20A-20T from vertex 80A of set edge 78A of path 76'. Terminal 60 is three horizontal channels 20A-20T and thirteen vertical channels 18A-18CC from terminal 74A of path 70'. Terminal 68 will therefore be identified as the current closest terminal (step 36-9).

Figure 6D:
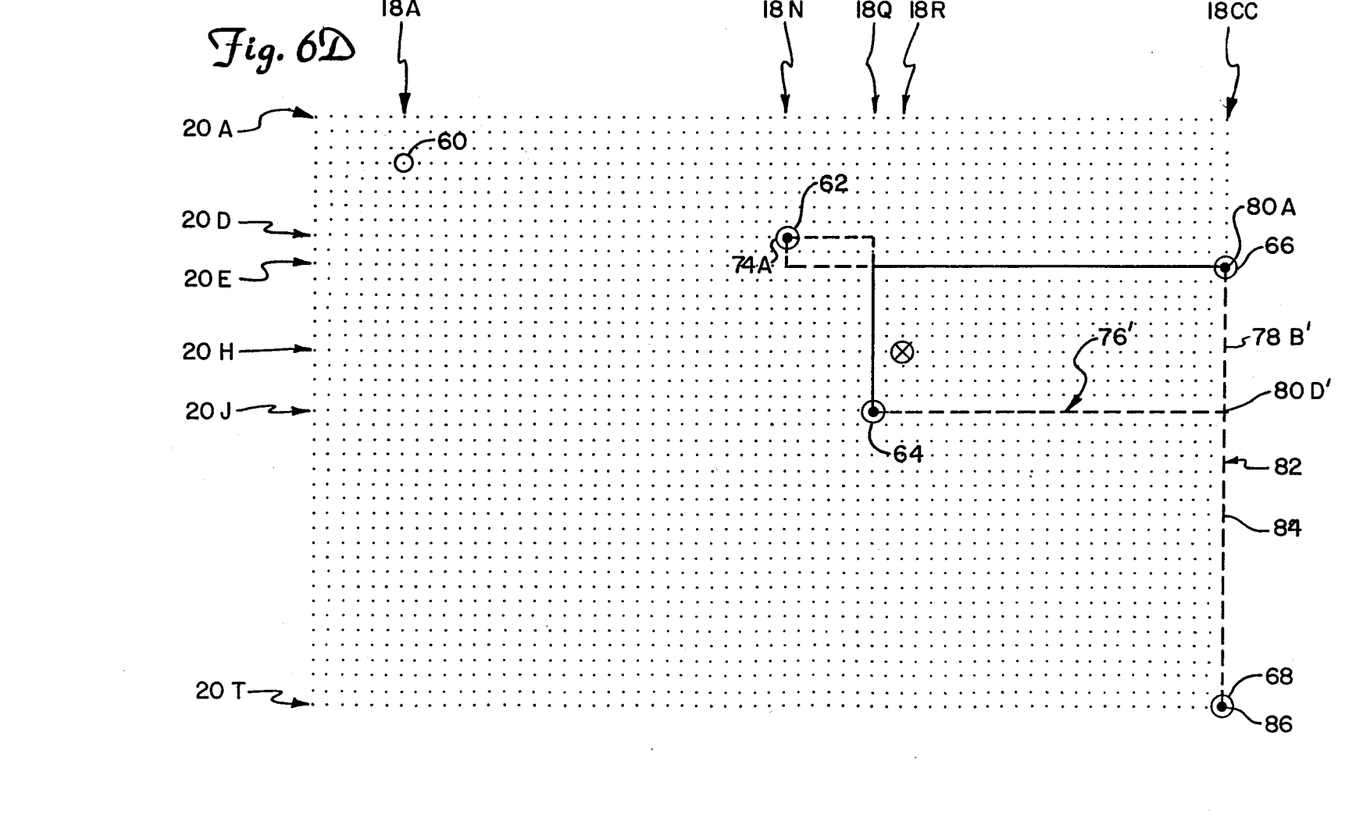

Having identified terminal 68 as the closest terminal, a new shortest path between terminal 68 and vertex 80A of path 76' must be established along horizontal channels 20A-20T and/or vertical channels 18A-18CC (step 36-10). As shown in FIG. 6D, shortest path 82 is a line coupling terminal 68 to vertex 80A of path 76'. Path 82 has an edge 84 (part of which is common with edge 78B' of path 76') and vertices 86 and 80A (step 36-10(b)). Vertex 86 is located at the same position as terminal 68. Vertex 80A is common with vertex 80A of path 76', and is located at the same position as terminal 66.

Figure 6E:
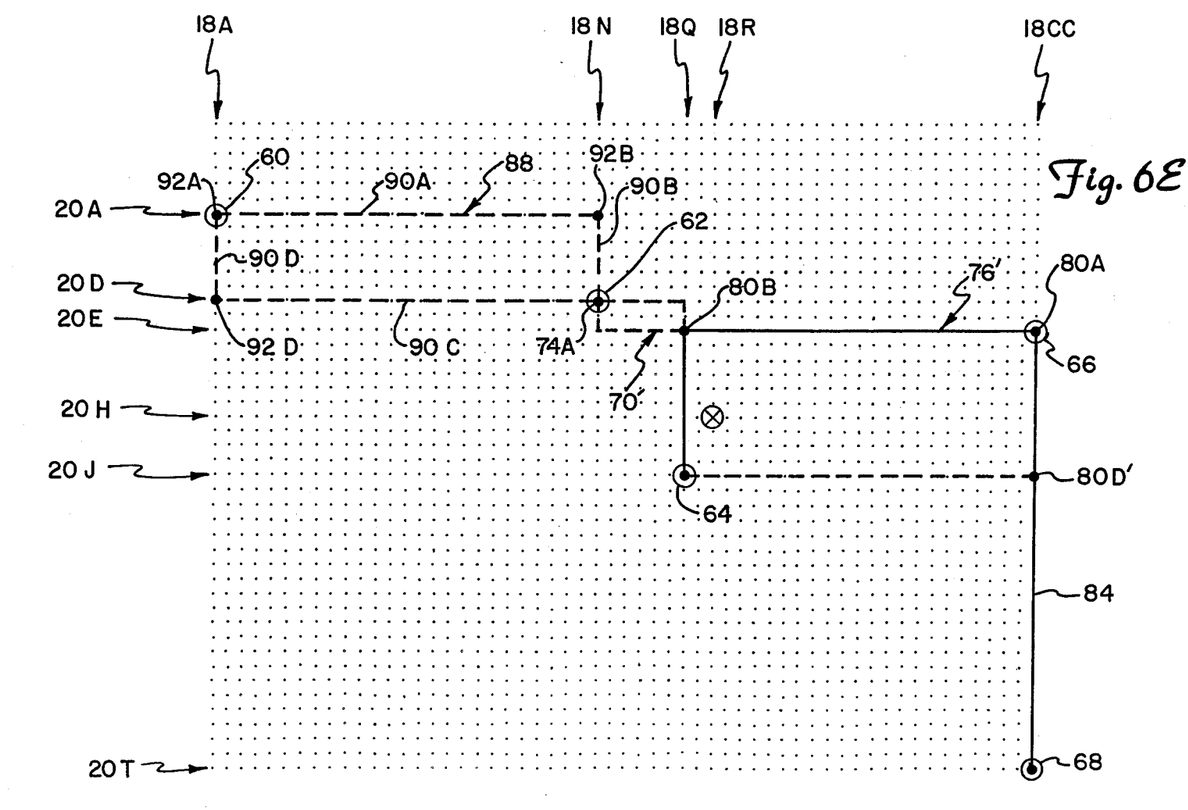

Since current shortest path 82 is a line and has a vertex in common with a vertex of established path 76' (i.e., vertex 80A), edge 84 of path 76 is set as a routing channel as indicated by solid lines in FIG. 6E (step 36-12).

Shortest path 82 now couples terminal 86 to a vertex of a set edge (i.e., vertex 80A of edge 78) of established path 76'. Since established path 76' already had its edges 78A and 78D' set, it will not have additional edges set, in accordance with step 36-11. Also, since the conditions of steps 36-13 and 36-14 are not met, neither path 76' or 82 is reestablished.

Having set edge 84 as a routing channel, computer 100 continues implementing the router algorithm by again repeating steps 36-8 through 36-15. Since terminal 60 is the only remaining terminal of the net, it will be identified as the closest terminal for the next sequence of steps. Terminal 60 is closest to vertex 74A of path 70' which is at the same location as terminal 62. Path 70' is therefore the established path for this sequence of steps.

Shortest path 88 between terminals 60 and 62 is established in accordance with step 36-10. As shown in FIG. 6E, shortest path 88 is a rectangle and has four edges 90A-90D, and four vertices 92A, 92B, 74A and 92D. Vertex 92A is located at the same position as terminal 60, while vertex 74A is a common vertex with path 70'. In this example, current established path 70' does not have two vertices which are terminals (i.e., only vertex 74A is a terminal) so following step 36-11, computer 100 will not set edges of path 70' as routing channels. Current shortest path 88 is not a line, so following step 36-12, none of its edges are set as routing channels either. Similarly, since shortest path 88 is not a line, neither path 70' nor path 88 are reestablished (steps 36-13 and 36-14).

After all terminals of a given net have been linked or coupled together by paths in the manner described above (e.g., terminals 62, 64, 66, 68 are coupled by paths 70', 76', 82 and 88), horizontal portions or segments of the set edges of these paths (e.g., edge 78A) are assigned to specific tracks 24 within the horizontal channels 20A-20T as indicated at step 38 in FIG. 3 and described above. Finally, after all nets on gate array 10 have been global routed and maze routed in accordance with steps 36 and 38 and illustrated in FIG. 3, vertical segments of the set edges are assigned to specific vertical tracks 22 within the vertical channels 18A-18CC as indicated at stop 42 and described above.

It is evident from FIG. 6E, however, that no edges of paths 70' or 88 have been set. Specific routing channels by which terminals 60 and 62 are coupled to vertex 80B, and therefore to terminals 64, 66 and 68, are not determined. In one embodiment of the present invention, computer 100 is free to use any track 22 and 24 within any vertical channel 18A-18CC and horizontal channel 20A-20T, respectively, encompassed by and including the edges of paths 70' and 88 when maze routing (step 38) and global routing (step 42). Terminal 60 can be coupled to terminal 62, for example, using portions of any tracks 22 within vertical channels 18A-18N, and tracks 24 within horizontal channels 20A-20D. In a similar manner, terminal 62 can be coupled to vertex 80B (and therefore terminals 64, 66 and 68 through set edges 76' and 84), using portions of any tracks 22 within vertical channels 18N-18Q and tracks 24 within horizontal channels 20D and 20E. Tracks 22 and 24 can therefore be flexibly utilized by computer 100 in response to routing demands or requirements from other nets.

The router of the present invention has significant advantages over those of the prior art. Tests have shown it to be very reliable in that it can accurately assign virtually all required routing paths. Length of the interconnect paths, and therefore the amount of metal required, is kept to a minimum. As discussed above, routing paths can be flexibly utilized in response to demands from other nets to be interconnected. The router is also relatively fast.

Although the present invention has been described with reference to preferred embodiments, workers skilled in the art will recognize that changes may be made in form and detail without departing from the spirit and scope of the invention.

What is claimed is:

1. A method for operating a digital computer to set routing paths along an x-y grid of possible paths, between a group of terminals on an integrated circuit, including:
   (a) determining an average x-y position on the grid of the terminals to be interconnected;
   (b) identifying a first terminal of the group which is closest to the average position along x and/or y paths of the grid;
   (c) identifying a second remaining terminal of the group which is closest to the first terminal along x and/or y paths of the grid;
   (d) establishing a first path along x and/or y paths of the grid between the first and second terminals, wherein the first path is rectangular and has four edges and four vertices including the first and second terminals when the first and second terminals are on different x and different y paths, and wherein the first path is a line and has one edge and two vertices including the first and second terminals when the first and second terminals are on the same x or same y path;
   (e) setting the edge of the first path as a routing path if the first path is a line;
   (f) identifying a closest remaining terminal of the group which is closes along x and/or y paths of the grid, to an edge of vertex of an established path having no set edges, or to a set edge or its vertices of an established path which has a set edge, whichever is closest;
   (g) establishing a shortest path along x and/or y paths of the grid between the closest terminal identified in step (f) and the edge or vertex of the established path to which it was closest, wherein the shortest path is rectangular and has four edges and four vertices including the closest terminal and a vertex common with a vertex of the established path when the shortest path traverses both x and y paths of the grid, and wherein the shortest path is in line and has an edge and two vertices including the closest terminal when the shortest path traverses only x or only y paths of the grid;
   (h) setting as a routing path edges of the established path which couple its vertices which include terminals and which have a vertex in comman with the shortest path, if the established path and shortest path have a common vertex, if the established path has no set edges, and if the common vertex does not include a terminal;
   (i) setting as a routing path the edge of the shortest path which couples the closest terminal to the edge of vertex of the established path if the shortest path is a line and has a vertex common with a vertex of the established path, or is a line and has a vertex at a set edge of the established path; and
   (j) repeating steps (f) through (i) for remaining terminals of the group to be interconnected.

2. The method of claim 1 and further including setting as a routing path any of the possible paths within and including edges of the established paths which have no set edges and which couple the terminals of the established paths to a set edge or its vertices of an established path having a set edge.

3. The method of claim 1 and further including, between steps (i) and (j):
   (k) reestablishing the established path to which the closest terminal was closest if the established path is a rectangle with no set edges and the shortest path is a line which does not have a vertex common with a vertex of the established path, wherein the reestablished established path is rectangular and has four edges and four vertices including two vertices of the established path and a vertex common with the vertex of the shortest path which intersected the established path;
   (l) reestablishing the shortest path if the shortest path is a line and does not have a vertex common with a vertex of the established path to which the closest terminal was closest (prior to being reestablished if it was reestablished), wherein the reestablished shortest path is a rectangle and has four edges and four vertices including a vertex including a the closest terminal, a vertex at the intersection of the shortest path and the established path or the reestablished established path, and a vertex common with a vertex of the established path (prior to being reestablished if it was reestablished) which includes a terminal; and
   (m) setting as a routing path edges of the reestablished shortest path which couple its vertices which include terminals and which have a vertex common with a vertex of the established path or the reestablished established path.

4. The method of claim 1 and further including setting as routing paths any of the possible paths within and including the edges of the established paths which have no set edges and which couple the terminals of the established paths to a vertex or set edge of an established path having a set edge.

5. A method for operating a digital computer to set routing paths, along an x-y grid of possible paths, between a group of terminals on an integrated circuit, including:
   (a) determining an average x-y position on the grid of the terminals to be interconnected;
   (b) identifying a first terminal of the group which is closest to the average position along x and/or y paths of the grid;
   (c) identifying a second remaining terminal of the group which is closest to the first terminal along x and/or y paths of the grid;
   (d) establishing a first path along x and/or y paths of the grid between the first and second terminals, wherein the first path is rectangular and has four edges and four vertices including the first and second terminals when the first and second terminals are on different x and different y paths, and wherein the first path is a line and has one edge and two vertices including the first and second terminals when the first and second terminals are on the same x or same y path;
   (e) setting the edge of the first path as a routing path if the first path is a line;
   (f) identifying a closest remaining terminal of the group which is closest, along x and/or y paths of the grid, to an edge or vertex of an established path having no set edges, or to a set edge or its vertices of an established path which has a set edge, whichever is closest;

(g) establishing a shortest path along x and/or y paths between the closest terminal identified in step (f) and the edge or vertex of the established path to which it was closest, wherein the shortest path is rectangular and has four edges and four vertices including the closest terminal and a vertex common with a vertex of the established path when the shortest path traverses both x and y paths, and wherein the shortest path is a line and has an edge and two vertices including the closest terminal when the shortest path traverses only x or only y paths;

(h) setting as a routing path edges of the established path which couple its vertices which are also terminals and which have a vertex common with a vertex of the shortest path, if the established path and shortest path have a common vertex, if the established path has no set edges, and if the common vertex does not include a terminal;

(i) setting as a routing path the edge of the shortest path which couples the closest terminal to the edge, or vertex of the established path if the shortest path is a line and has a vertex common with a vertex of the established path, or is a line and has a vertex at a set edge of the established path;

(j) reestablishing the established path to which the closest terminal was closest if the established path is a rectangle with no set edges and the shortest path is a line which does not have a vertex common with a vertex of the established path, wherein the reestablished established path is rectangular and has four edges and four vertices including two vertices of the established path and a vertex common with the vertex of the shortest path which intersected the established path;

(k) reestablishing the shortest path if the shortest path is a line and does not have a vertex common with a vertex of the established path to which the closest terminal was closest (prior to being reestablished if it was reestablished), wherein the reestablished shortest path is a rectangle and has four edges and four vertices including a vertex at the location of the closest terminal, a vertex at the location at which the shortest path intersected the established path or the reestablished established path, and a vertex common with a vertex of the established path (prior to being reestablished if it was reestablished), which includes a terminal;

(l) setting as a routing path edges of the reestablished shortest path which couple its vertices which include terminals and which have a vertex common with a vertex of the established path or the reestablished established path; and (m) repeating steps (f) through (l) for remaining terminals of the group to be interconnected.

6. The method of claim 5 and further including setting as routing paths any of the possible paths within and including the edges of the established paths which have no set edges and which couple the terminals of the established paths to a vertex or set edge of an established path having a set edge.

* * * * *

UNITED STATES PATENT AND TRADEMARK OFFICE
CERTIFICATE OF CORRECTION

PATENT NO. : 4,852,015
DATED : July 25, 1989
INVENTOR(S) : John J. Doyle, Jr.

It is certified that error appears in the above-identified patent and that said Letters Patent is hereby corrected as shown below:

Column 11, line 37 delete "closes" and therefore insert --closest--.

Column 11, line 63 delete "of", and therefore insert --or--.

Column 12, line 25 after delete "a" (second occurrence).

Signed and Sealed this

Fifth Day of June, 1990

Attest:

HARRY F. MANBECK, JR.

*Attesting Officer*  *Commissioner of Patents and Trademarks*